United States Patent [19]
Tabasky et al.

[11] Patent Number: 5,182,782
[45] Date of Patent: Jan. 26, 1993

[54] WAFERBOARD STRUCTURE AND METHOD OF FABRICATING

[75] Inventors: Marvin Tabasky, Peabody; Victor Cataldo, Wilmington; Thomas W. Fitzgerald, Framingham; Jagannath Chirravuri, Medfield; Craig A. Armiento; Paul O. Haugsjaa, both of Acton, all of Mass.

[73] Assignee: GTE Laboratories Incorporated, Waltham, Mass.

[21] Appl. No.: 817,570

[22] Filed: Jan. 7, 1992

Related U.S. Application Data

[63] Continuation-in-part of Ser. No. 551,219, Jul. 11, 1990, Pat. No. 5,077,878.

[51] Int. Cl.$^5$ .............................................. G02B 6/42
[52] U.S. Cl. ........................................ 385/89; 385/88
[58] Field of Search ..................... 385/89, 90, 91, 92, 385/93, 94

[56] References Cited

U.S. PATENT DOCUMENTS

| | | | |
|---|---|---|---|
| 4,730,198 | 3/1988 | Brown et al. | 385/91 X |
| 4,750,799 | 6/1988 | Kawachi et al. | 385/89 |
| 4,844,581 | 7/1989 | Turner | 385/91 |
| 4,930,854 | 6/1990 | Albares et al. | 350/96.17 |
| 5,011,246 | 4/1991 | Corradetti et al. | 385/92 |

FOREIGN PATENT DOCUMENTS

| | | | |
|---|---|---|---|
| 0134882 | 8/1984 | Japan | 437/706 |
| 0223185 | 11/1985 | Japan | 372/50 |

OTHER PUBLICATIONS

Henry et al. "Glass waveguide on silicon for Hybrid Optical Packaging." J. of Light. Tech. vol. 7 No. 10 paper 1530-1539 (Oct. 1989).
Jackson et al., "Optical Fiber Coupling Approaches for Multi-Channel Laser and Detector Arrays," SPIE vol. 994 Optoelectronic Materials, Devices, Pack., and Interconn. II, pp. 40-47 (1988).
Hillerich and Geyer, "Self-Aligned Flat-pack Fibre--Photodiode Coupling," Elect. Letters, vol. 24, No. 15, paper 918-919 (1988).

*Primary Examiner*—John D. Lee
*Assistant Examiner*—Phan T. Heartney
*Attorney, Agent, or Firm*—Victor F. Lohmann, III

[57] ABSTRACT

A waferboard assembly incorporates mechanical registration features into a substrate platform to facilitate the passive alignment of lasers integrated on a chip to fibers in integral contact with the substrate. The waferboard includes two front pedestal structures and one side pedestal structure, and two vertical post structures within a mounting region defined by the pedestal structures. The laser chip is mounted on the vertical post structures, and placed in concurrent abutting contact with the pedestal structures. The waferboard is fabricated by etching the substrate to form the front and side pedestal structures, and etching the substrate to define the grooves. In order to form the post structures, a polyimide material is deposited on the substrate using an appropriate mask.

7 Claims, 7 Drawing Sheets

WAFERBOARD STRUCTURE AND METHOD OF FABRICATING

CROSS-REFERENCE TO RELATED APPLICATIONS

This application is a continuation-in-part of copending application entitled "Method and Device for Passive Alignment of Diode Lasers and Optical Fibers", Ser. No. 07/551,219, filed Jul. 11, 1990 by Armiento et al., assigned to the same assignee as the present application, which is to issue as U.S. Pat. No. 5,077,878 on Jan. 7, 1992.

FIELD OF THE INVENTION

The present invention relates to optical component packaging and, more particularly, to an assembly for passively aligning diode lasers to optical fibers, and a method of fabricating such an assembly.

This application is further related to copending application entitled "Method of Establishing Soldered Connections", Ser. No. 07/759,246 filed Sept. 13, 1991 by Fitzgerald et al., assigned to the same assignee as the present application, and copending application entitled "METHOD AND APPARATUS FOR ASSEMBLING A FIBER ARRAY", Ser. No. 07/760,049, filed Sept. 13, 1991 by J. A. Cambriello, and assigned to the same assignee as the present application.

Copending applications Ser. No. 07/551,219, 07/759,246, and 07/760,049 are hereby incorporated by reference into this application.

BACKGROUND OF THE INVENTION

Long-haul optical telecommunication networks currently utilize high performance optoelectronic components such as lasers and photodetectors that are coupled to single mode optical fibers. Although presently these components are expensive, their effective cost is low since they are shared among thousands of customers. The economic situation is beginning to change as telephone companies extend the optical fiber network directly to the home. Expansion of optical fiber into the local loop will require several optoelectronic, electronic and fiber components for each customer. This situation will impose significant demands on realizing optoelectronic components that can be manufactured at low cost.

The cost of all optoelectronic (and most electronic) components is dominated by the package rather than the device itself. For example, the alignment and attachment of an optical fiber pigtail and a diode laser in an optical transmitter are the most costly packaging steps. The cost of this operation for a single transmitter will be multiplied for applications involving the use of many parallel transmitters in the local loop in which arrays of lasers are coupled to arrays of single mode fibers.

In addition to telecommunication applications, the issue of low cost optoelectronic components will also determine the economic viability of other applications of optoelectronic technology such as the use of optical interconnects in high speed computers.

The conventional approach to attachment of a fiber pigtail to a diode laser package is a labor intensive process. The laser must first be die and wire bonded to the package so that it can be biased to its normal operating condition. The input end of the fiber pigtail is then mechanically manipulated in front of the laser active region while the optical output of the fiber is monitored until optimal coupling is achieved. A single mode fiber (9 $\mu$m core diameter) must be positioned with submicron accuracy in front of the laser emitting region, which typically has dimensions of about $2 \times 0.2$ $\mu$m. Once the maximum coupling has been obtained, the fiber is bonded into place.

Disadvantageously, this approach requires either human interaction or expensive equipment that automatically dithers the fiber to its optimal position. An additional disadvantage is that the fiber can move from its optimal position during the process of attachment to the package due to the motion of bonding materials (such as epoxy shrinkage) or during the use of the laser in the field. This conventional alignment technique will be significantly more complicated as the need develops for the coupling of laser arrays to fiber arrays.

The alignment of fiber arrays to laser arrays has been reported for the case of multimode fibers (50 $\mu$m core diameter) by Jackson et al. in "Optical fiber coupling approaches for multichannel laser and detector arrays," SPIE Vol. 994 (1988).

OBJECTS OF THE INVENTION

It is a principal object of the present invention to obviate the above-noted and other disadvantages of the prior art.

It is a further object of the present invention to fabricate an assembly which permits alignment of a laser array to a fiber array using a strictly passive alignment procedure.

It is a further object of the present invention to fabricate a waferboard assembly which enables precise positioning of the fiber relative to the laser active region with the potential for submicron accuracy.

SUMMARY OF THE INVENTION

In one aspect of the invention, a package, including a substrate, aligns a plurality of optical receiving elements to a plurality of active elements integrated on a chip. The package comprises two front pedestal structures and one side pedestal structure at respective locations on a surface of said substrate, and two vertical post structures at respective locations on the surface of said substrate. The chip is mounted on said vertical structures in abutting contact with said front pedestal structures and with said side pedestal structure, such that said receiving elements are in optical communication with said active elements.

In another aspect of the present invention, a method is provided for fabricating a waferboard assembly having a substrate. The method comprises the steps of etching the substrate to form one side pedestal structure and two front pedestal structures, etching the substrate to define grooves in said substrate, and masking said substrate and depositing a polyimide material on said masked substrate to form at least two post structures within a mounting region defined by said pedestal structures.

DETAILED DESCRIPTION OF THE PREFERRED EMBODIMENTS

Figure 1:
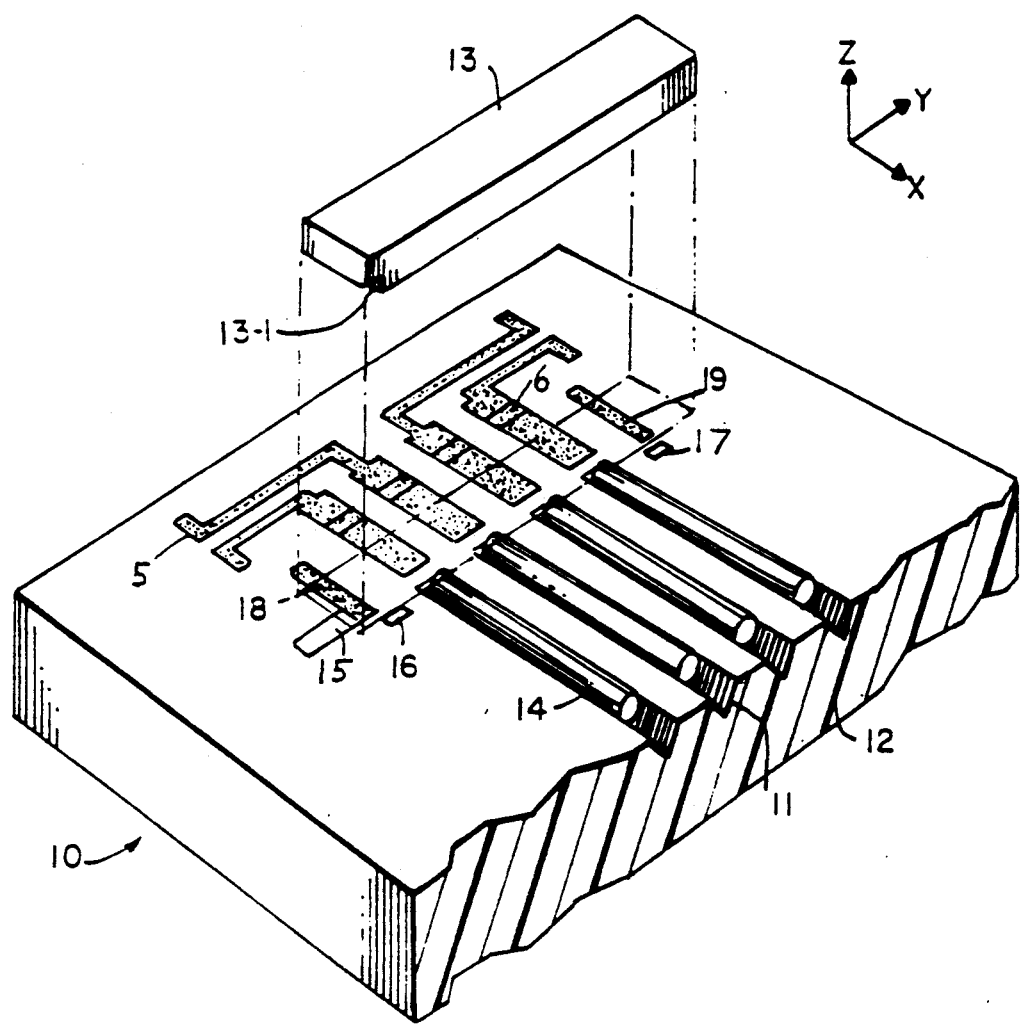
FIG. 1 is a perspective view of an exemplary waferboard structure according to the present invention.

FIG. 1 illustrates a waferboard structure 10 used as a platform for passively aligning a four-element laser array chip 13 to a four-fiber array with individual fibers 14. In accordance with the present invention, the waferboard includes three pedestals 15, 16, and 17 fabricated at predetermined locations on substrate 12 to facilitate positioning of the laser array chip on the substrate. A mating channel (inset) is preferably fabricated into the laser chip as a lip extending over pedestal 15.

The laser array chip 13 is positioned in the x and y directions by being placed in concurrent abutting contact with the three pedestals, 15, 16, and 17, wherein the position of the laser array in the x direction (towards the fibers) is determined by front pedestals 16 and 17, while alignment of the center line of the laser active regions to the center of the fiber cores in the y-direction is achieved by side pedestal 15. The chip 13 rests on vertical pedestal standoff structures 18 and 19 which determine the position of the chip in the z-direction.

FIGS. 2-5 illustrate the processing steps in fabricating a waferboard structure in accordance with a preferred embodiment of the present invention. Similar structures and layers throughout the drawings are represented by common numbering.

FIG. 2 diagramatically presents a series of intermediate waferboard structures illustrating the process for fabricating micromachined silicon alignment pedestals 15, 16, and 17 on substrate 12. In accordance with a preferred embodiment of the present invention, a 3-inch (100)-oriented silicon wafer 20 mils thick is provided as a starting wafer substrate 12. The wafer is initially cleaned in an FSI system. A layer 21 of silicon dioxide is grown in a steam ambient on substrate 12 to a thickness of $1\mu$.

Figure 2A:
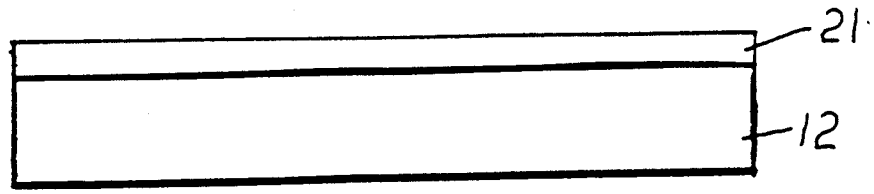
FIGS. 2-5 (2A-2B, 3A-3C, 4A-4D and 5A-5G) present a series of illustrative diagrams outlining the sequential processes for fabricating a waferboard assembly of the present invention.
Figure 2B:
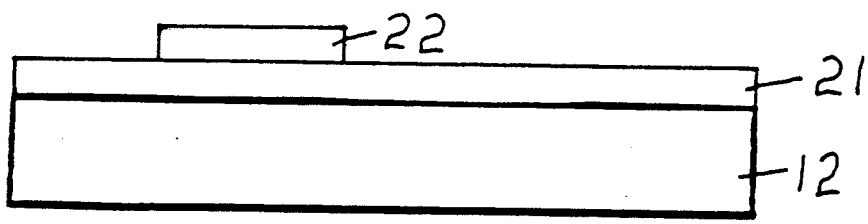
Figure 2C:
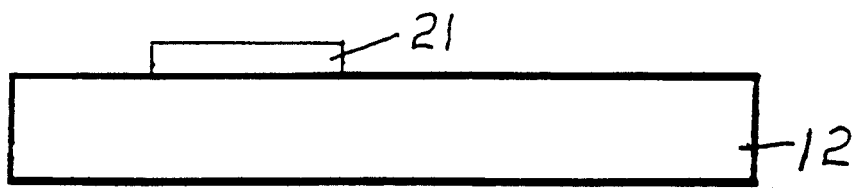
Figure 2D:
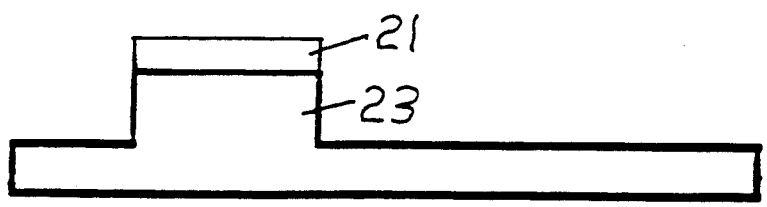
Figure 2E:
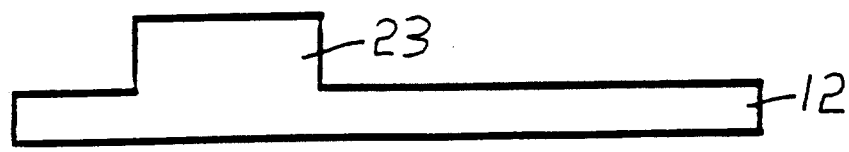

A post aligner mask is used to deposit a $1\mu$-thick layer of photoresist 22 on oxide layer 21. The oxide is plasma-etched in a Perkin Elmer Omni System with a fluorine etch chemistry, and the photoresist is removed to produce the structure in FIG. 2C. The silicon substrate is then plasma-etched in a PLASMA THERM C12 system with a chlorine etch chemistry to form a pedestal structure 23 capped with oxide 21. As shown in FIG. 2D, the oxide serves as a mask for facilitating development of the post during silicon etching. The protective mask of oxide growth 21 is stripped to fully expose the pedestal 23 as shown in FIG. 2E.

Figure 3A:
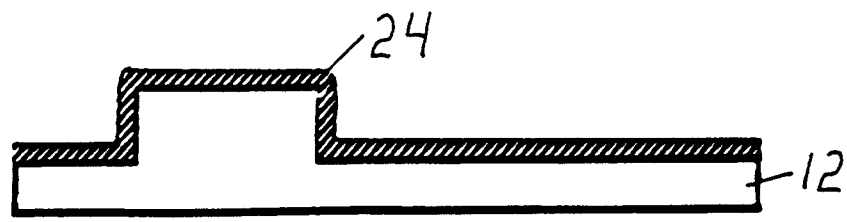
Figure 3B:
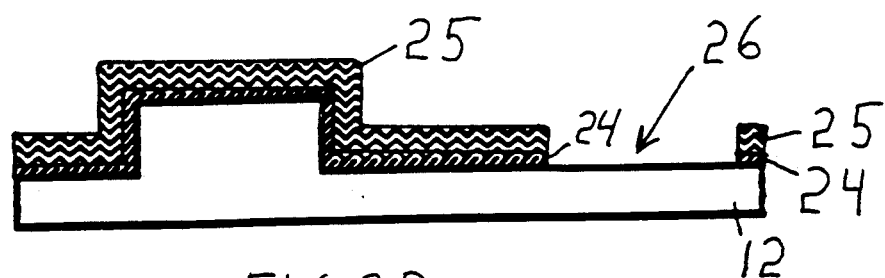
Figure 3C:
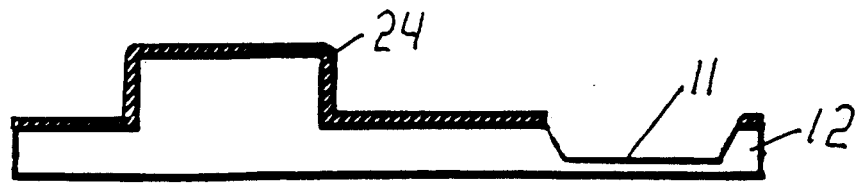

The next sequence of fabrication steps illustrated in FIGS. 3A-C define the silicon V-grooves 11 in the wafer substrate. As shown in FIG. 3A, low pressure chemical vapor deposition (LPCVD) is used to uniformly deposit a $0.1\mu$-thick layer 24 of silicon nitride on the wafer structure in FIG. 2E. A photoresist layer 25 with a thickness of $4.5\mu$ is then deposited on the silicon nitride layer. An appropriate photolithographic mask defines a groove area 26 where plasma etching with a fluorine chemistry in a SLOAN system removes silicon nitride to expose a portion of the substrate as shown in FIG. 3B. The remainder of the photoresist masking layer 25 is then removed.

The exposed substrate is controllably etched at a rate of $0.7\mu$/minute with a KOH/alcohol mix at 80° C. to produce a groove 11.

Figure 4A:
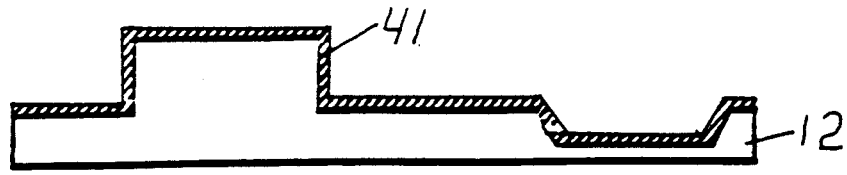
Figure 4B:
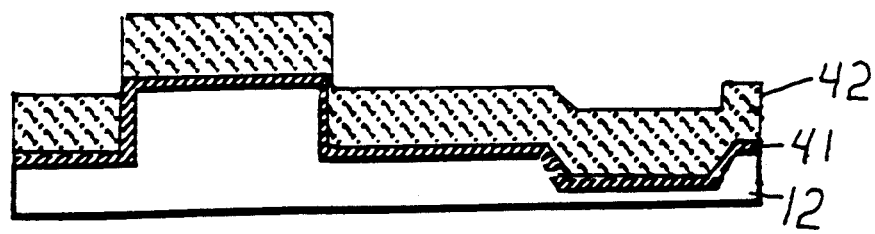
Figure 4C:
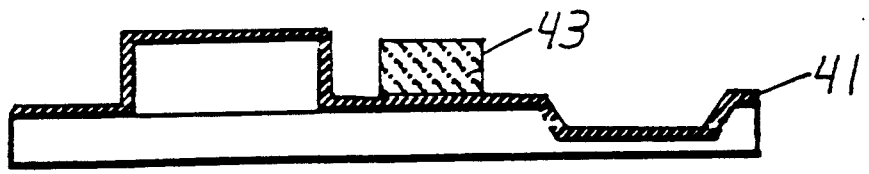

The next processing steps shown in FIGS. 4A-C define the vertical pedestal standoff structures 18 and 19. The nitride layer in FIG. 3C is stripped using an HF solution, cleansed with an $H_2SO_4/H_2O_2$ solution, and recoated with a 1000Å thick deposit of nitride 41 to form the structure of FIG. 4A.

A photosensitive polyimide material is spun on the FIG. 4A wafer at 2500 RPM for 25 seconds to form a $6\mu$-thick polyimide layer 42. The wafer is laid flat and baked at 110° C. for 30 minutes. A photolithographic pedestal mask is used to expose and develop the wafer of FIG. 4B to produce the wafer of FIG. 4C having a pedestal structure 43. The pedestal is cured by baking to form the wafer structure of FIG. 4D.

The processing steps of FIG. 5A-D define the metal regions on substrate 12 for die mounting of bypass capacitors and laser driver circuitry or for providing a ground layer for a multilayer interconnect structure that would incorporate the necessary bypass capacitance and provide for mounting of the driver circuitry.

Figure 4D:
Figure 5A:
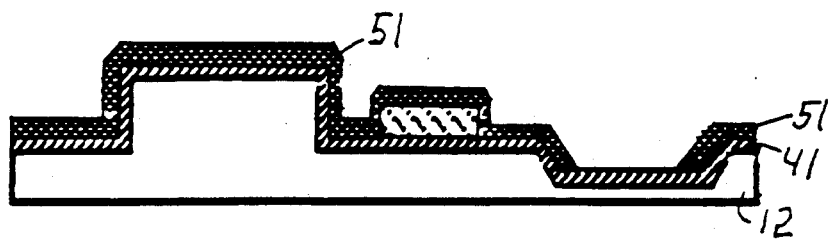
Figure 5B:
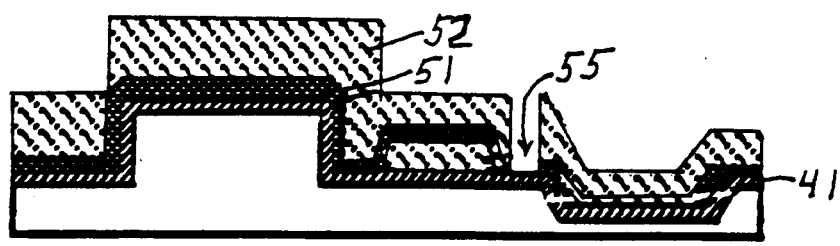
Figure 5C:
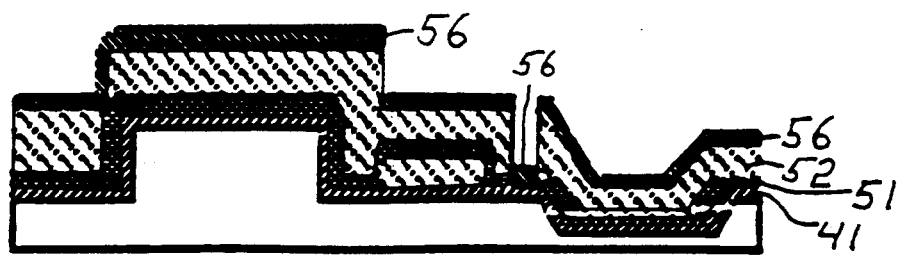
Figure 5D:
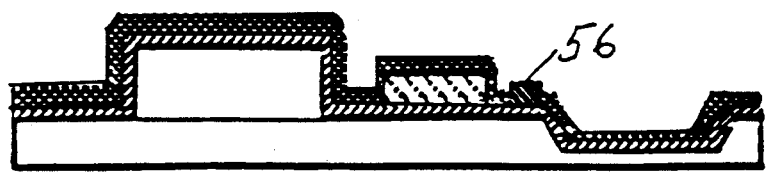

A deposit of plasma silicon nitride 51 is made on the structure of FIG. 4D at a thickness of $0.2\mu$ as shown in FIG. 5A. A photosensitive polyimide mask is used to deposit a polyimide layer 52 on the silicon nitride layer 51, except for a desired region 55 as shown in FIG. 5B. A suitable metal layer 56 with a thickness of $0.7\mu$ is then deposited on the polyimide 52 and on the exposed plasma-deposited silicon nitride in region 55 as shown in FIG. 5C. A liftoff step using methylene chloride and ultrasonic agitation removes the deposited metal outside region 55 to produce the structure of FIG. 5D and pattern 1 (FIG. 6).

The resultant waferboard structure has a silicon pedestal height of $9\mu$, a groove depth of approximately $150\mu$, and a polyimide pedestal height (when cured) of $5\mu$. Although FIGS. 2-5 illustrate the formation of a single pedestal, groove, and vertical post, any number of such structures can be fabricated at desired location with the same number of processing steps by using an appropriate mask.

The following steps are used only if multilayer metal is required. A dielectric film is deposited on the structure of FIG. 5D using PECVD. An appropriate mask is used to deposit polyimide on selected areas. The PECVD film is then etched in fluorine chemistry to open contacts to the base metal and then metal 2 is deposited on the polyimide. A lift-off step using methylene chloride and ultrasonic agitation removes the deposited metal from selected areas.

Figure 5E:
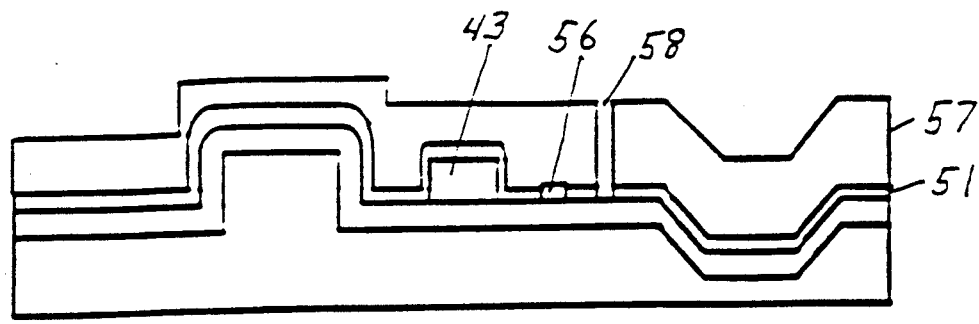
Figure 5F:
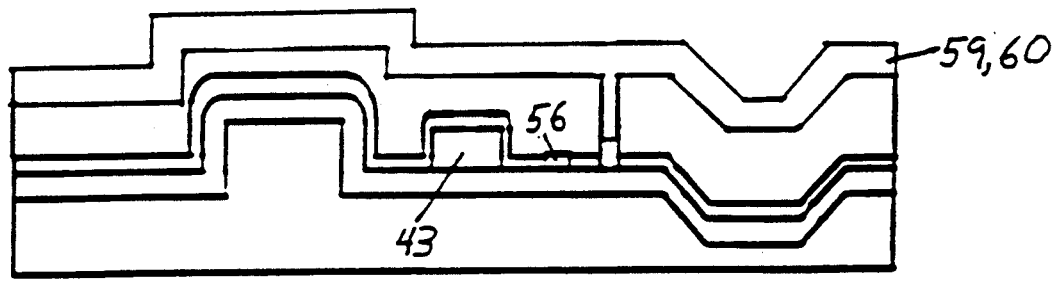
Figure 5G:
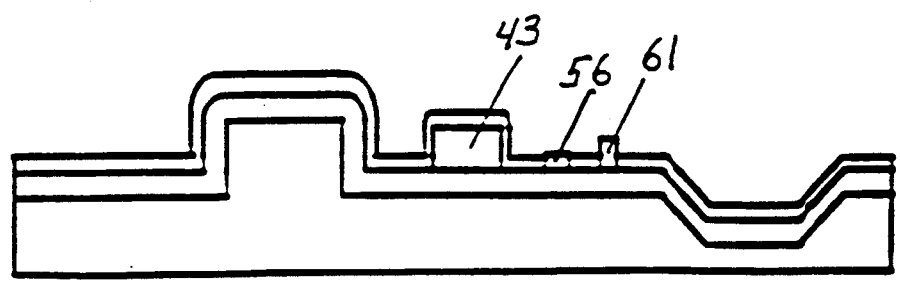
Figure 6:
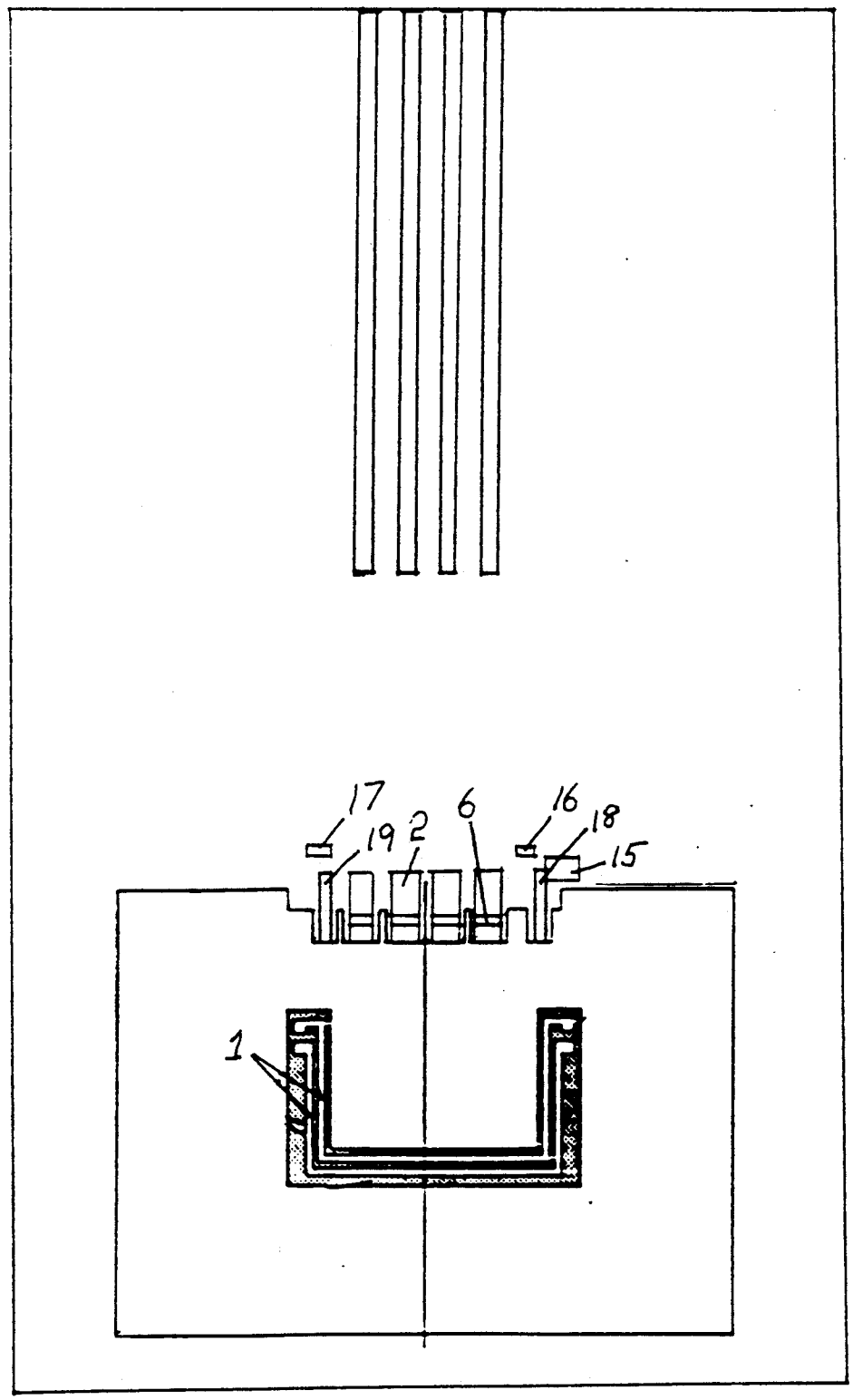
FIG. 6 is an upper perspective view of the fabricated waferboard assembly.

The following steps shown in FIG. 5E-G illustrate the formation of the metallization pattern 2 in FIG. 6. A photosensitive polyimide mask is used to define a polyimide layer 57 on the silicon nitride 51 except for a desired region 58 as shown in FIG. 5E. Metal with a consistency of Ti-Ni-Au 59 is then deposited uniformly on the wafer followed by uniformly deposited indium solder 60, FIG. 5F. The metal and solder outside the metallization region are removed with methylene chloride and ultrasonic agitation leaving metal deposit 61 as the metal wettable pads discussed in the copending application of John Cambriello (FIG. 5G).

The formation of solder dam regions at selected areas of the metallization is accomplished via definition of photosensitive polyimide at the selected areas shown as 6 in FIG. 1 and as 2 in FIG. 6. These dam regions are used to prevent solder from flowing to undesired regions of the metallization pattern. At this point in the fabrication, the wafer is ready for sawing into individual waferboard substrates for the mounting of laser arrays and electronics and final packaging.

The preferred embodiment is illustrative of the present invention, and therefore should not serve to limit the scope of the present invention. It should be obvious to those skilled in the art that other processing steps, materials, and dimensions may be used within the scope of the present invention.

While there has been shown and described what are at present considered the preferred embodiments of the invention, it will be obvious to those skilled in the art that various changes and modifications can be made therein without departing from the scope of the invention as defined by the appended claims.

What is claimed is:

1. A package, including a substrate, for aligning a plurality of optical receiving elements to a plurality of active elements integrated on a chip, comprising:
    two front pedestal structures and one side pedestal structure at respective locations on a surface of said substrate;
    two vertical pedestal structures at respective locations on the surface of said substrate;
    wherein said chip is mounted on said vertical structures in abutting contact with said front pedestal structures and with said side pedestal structure, such that said receiving elements are in optical communication with said active elements.

2. The package as recited in claim 1 wherein said chip includes:
    a mating channel with a vertical sidewall which abuts said side pedestal structure.

3. The package as recited in claim 1 wherein said optical receiving elements include: an array of optical fibers.

4. The package as recited in claim 3 wherein said chip includes:
    an array of lasers.

5. The package as recited in claim 3 further comprises:
    an array of fiber-receiving grooves in said substrate.

6. The package as recited in claim 1 further comprises:
    a metallization pattern for providing electrical contact to the active elements of said chip.

7. The package as recited in claim 5 wherein:
    a geometric relationship exists between the locations of said pedestal structures, said active elements, and said optical fibers.

* * * * *